United States Patent [19]

Sinta et al.

[11] Patent Number: 5,719,003
[45] Date of Patent: Feb. 17, 1998

[54] METHOD FOR INCREASING THE DIFFERENTIAL SOLUBILITY OF AN IMAGED PHOTORESIST THROUGH HYDROXY GROUP BLOCKING VIA REACTION WITH VINYL ETHERS

[75] Inventors: Roger F. Sinta, Woburn; Daniel Y. Pai, Millbury; Timothy G. Adams, Sudbury, all of Mass.

[73] Assignee: Shipley Company, L.L.C., Marlborough, Mass.

[21] Appl. No.: 534,565

[22] Filed: Sep. 27, 1995

[51] Int. Cl.$^6$ .................... G03F 7/023; G03F 7/38
[52] U.S. Cl. .................... 430/169; 430/327; 430/330
[58] Field of Search .................... 430/190, 191, 430/192, 193, 330, 168, 169, 327

[56] References Cited

U.S. PATENT DOCUMENTS 4,732,837  3/1988  Potvin et al. .................... 430/192
5,258,257  11/1993  Sinta et al. .................... 430/193
5,362,600  11/1994  Sinta et al. .................... 430/193

FOREIGN PATENT DOCUMENTS 0 536 690 A1  4/1993  European Pat. Off. .
0 552 548 A1  7/1993  European Pat. Off. .
H5-83543  11/1993  Japan .

*Primary Examiner*—Christopher G. Young
*Attorney, Agent, or Firm*—Robert L. Goldberg

[57] ABSTRACT

A photoresist composition comprising an alkali soluble resin and an ortho-naphthoquinone diazide sulfonic acid ester of a polyhydroxy alcohol. The photoresist is characterized by having at least a portion of its free hydroxyl groups on the photoactive compound blocked with an acid labile blocking group that generates a hydroxide upon cleavage.

6 Claims, No Drawings

METHOD FOR INCREASING THE DIFFERENTIAL SOLUBILITY OF AN IMAGED PHOTORESIST THROUGH HYDROXY GROUP BLOCKING VIA REACTION WITH VINYL ETHERS

BACKGROUND OF THE INVENTION

I. Introduction

This invention relates to positive-working photoresist compositions. More particularly, this invention relates to photoresist compositions containing o-quinone diazide sulfonic acid ester photoactive compounds having enhanced shelf life stability and differential solubility following exposure.

II. Description of the Prior Art

Photoresist compositions are well known in the art and described in numerous publications including DeForest, Photoresist Materials and Processes, McGraw-Hill Book Company, New York, 1975. Photoresist coating compositions are applied from liquid solution or as a dry film. When coated onto a substrate and exposed to light of the proper wavelength, are chemically altered in their solubility to certain solvents (developers). Two types are known. The negative-acting resist is initially a mixture which is soluble in its developer, but following exposure to activating radiation, becomes insoluble in developer thereby defining a latent image. Positive-acting resists work in the opposite fashion, light exposure making the resist soluble in developer.

Positive-working photoresists are more expensive than negative-working photoresists but are capable of providing superior image resolution. The greater expense of the positive working photoresist is due primarily to the cost of the photoactive compound used to formulate the photoresist. However, notwithstanding the higher cost of the positive photoresist, such materials are in substantial commercial use due to image resolution superior to negative acting photoresists. For example, positive-working photoresist using o-quinone diazide sulfonic acid ester photoactive compound can be developed to yield relief images having line widths of one micron or less. In addition, considering the cross section of a photoresist image, the channels formed in the resist by development have square corners and sidewalls with only minimal taper.

The positive-working photoresists typically comprise a light-sensitive component in a film-forming alkali soluble thermoplastic polymer binder. The light-sensitive compounds or photoactive compounds most frequently used are esters formed from o-quinone diazide sulfonic acids. These esters are well known in the art and are described by DeForest, supra, pages 47–55, incorporated herein by reference. Photoactive compounds and the methods used to make the same, are all well documented in prior patents including German Pat. No. 865,140 granted Feb. 2, 1953 and U.S. Pat. Nos. 2,767,092; 3,046,110; 3,046,112; 3,046,119; 3,046,121; 3,046,122; and 3,106,465, all incorporated herein by reference. Additional photoactive compounds that have been used in the formulation of positive-acting photoresists are shown in U.S. Pat No. 3,637,384, also incorporated herein by reference. These materials are formed by reaction of a suitable diazide of an aromatic sulfonyl chloride with an appropriate resin amine. Methods for the manufacture of these photoactive compounds and examples of the same are shown in U.S. Pat. No. 2,797,213, incorporated herein by reference. Other positive-working diazo compounds have been used for specific purposes. For example, a diazo compound used as a positive-working photoresist for deep UV lithography is Meldrum's diazo and its analogs as described by Clecak et al, Technical Disclosure Bulletin, Volume 24, Number 4, September 1981, IBM Corporation, pp. 1907 and 1908. An o-quinone diazide compound suitable for laser imaging is shown in U.S. Pat. No. 4,207,107. The aforesaid references are also incorporated herein by reference.

The resin binders most frequently used with the o-quinone diazide photoactive compounds in commercial practice are the alkali soluble phenol formaldehyde resins known as the novolak reins. Photoresists using such polymers are illustrated in U.K. Pat. No. 1,110,017, incorporated herein by reference. These materials are the product of reaction of a phenol with formaldehyde under conditions whereby a thermoplastic polymer is formed with a glass transition temperature of about 100° C. Novolaks with glass transition temperatures in excess of 100° C. are also known and exemplified in U.S. Pat. No. 5,266,440, which discloses novolak resins comprising the product resulting from the acid condensation of an aromatic aldehyde with a phenol resulting in resins having a molecular weight in excess of 1,500 Daltons and glass transition temperatures in excess of 125° C.

Another class of binders used with such photoresists are homopolymers and copolymers of vinyl phenol. Photoresists of this nature are disclosed in U.S. Pat. No. 3,869,292, supra.

In the prior art, the above-described positive resists using alkali soluble phenolic resins as a binder are most often used as masks to protect substrates from chemical etching in photo-engraving processes. For example, in a conventional process for the manufacture of a printed circuit board, a copper-clad substrate is coated with a layer of a positive-working photoresist, exposed to actinic radiation to form a latent circuit image in the photoresist coating, developed with a liquid developer to form a relief image and etched with a chemical etchant whereby unwanted copper is removed and copper protected by the photoresist mask is left behind in a circuit pattern. For the manufacture of printed circuit boards, the photoresist must possess chemical resistance, must adhere to the circuit board substrate, and for high density circuits, must be capable of fine-line image resolution.

Similar photoresists are also used in the fabrication of semiconductors. As in the manufacture of printed circuits, the photoresist is coated onto the surface of a semiconductor wafer and then imaged and developed. Following development, the wafer is typically etched with an etchant whereby the portions of the wafer bared by development of the photoresist are dissolved while the portions of the wafer coated with photoresist are protected, thereby defining a circuit pattern. For use in the manufacture of a semiconductor, the photoresist must possess resistance to chemical etchants, must adhere to the surface of the semiconductor wafer and must be capable of very fine-line image resolution.

To fabricate devices requiring fine-line resolution, it is necessary to use photoresist compositions that are particulate free. It is known in the art that the naphthoquinone diazide sulfonic acid ester photoactive compounds have a tendency to unexpectedly insolubilize in the photoresist composition and form particulates therein. It is also known that the tendency to form particulates is greatest with photoactive compounds having large molecules and multiple hydroxyl groups, especially phenolic hydroxyl groups. For example, it is known that photoactive compounds formed by the partial esterification of a polyhydroxy phenol with a naphthoquinone diazide sulfonic acid halide is especially susceptible to particulate formation in solution if the compound contains unesterified hydroxy substituents.

One method proposed in the prior art to prevent particulate formation of a naphthoquinone diazide sulfonic acid halide ester photoactive compound during storage is disclosed in U.S. Pat. No. 4,732,837, and in published Japanese Patent Application H5-83543 published Nov. 26, 1993, both incorporated herein by reference. In accordance with the procedure disclosed therein, unesterified hydroxyl groups—those not reacted with a naphthoquinone diazide sulfonyl halide, are reacted with an acylation or sulfonylation agent thereby chemically inactivating the hydroxyl groups with a concomitant decrease in the tendency of these materials to precipitate from solution during storage. Though it is believed that the process improves shelf life of a photoresist as reported, it is also believed that free hydroxyl groups are important to photospeed and dissolution of unexposed photoresist in developer. Consequently, acylation or sulfonylation of the hydroxyl groups decreases dissolution rate of an exposed photoresist thereby retarding the rate of development or requiring an increase in exposure dose for equivalent development speed.

SUMMARY OF THE INVENTION

The present invention provides an improved means for preventing particulate formation in a positive-working photoresist composition comprising an alkali soluble polymer and a photoactive compound that is the esterification product of a polyhydroxy alcohol, preferably a polyhydroxy phenol, and an o-quinone diazide sulfonyl halide.

In accordance with the process of the invention, unreacted (unesterified) hydroxyl groups following condensation of the o-quinone diazide sulfonic acid halide with the polyol are further reacted to convert the unreacted hydroxyl group to an acid labile blocking group to thereby increase shelf life by elimination of the more reactive hydroxy group. Upon exposure of the so formed photoactive compound to a source of activating radiation, photolysis results in generation of an indene carboxylic acid which cleaves or deblocks the acid labile group thereby regenerating hydroxyl groups. Consequently, during development, because the reaction product of photolysis results in regeneration of hydroxyl groups, the exposed film is more soluble in developer and there is no loss in dissolution rate.

The preferred acid labile blocking group in accordance with the invention is an acetal group formed by the reaction of the hydroxyl group with a vinyl ether compound. The acetal group is acid labile and readily cleaved by indene carboxylic acid formed by photolysis of the naphthoquinone diazide sulfonic acid ester. The group formed by deblocking of the acetal is a hydroxyl group.

DESCRIPTION OF THE PREFERRED EMBODIMENTS

The photoresists of this invention comprise an organic solution of an alkali soluble resin and an o-quinone diazide sulfonic acid ester of a polyhydroxy alcohol photoactive compound, preferably a polyhydroxy aromatic alcohol, where free (unesterified) hydroxyl groups are at least partially and preferably fully blocked with an acid labile blocking group, preferably an acetal group.

The alkali soluble resin component of the photoresist is typically a phenolic resin such as a novolak resin or a polyvinyl phenol resin.

Procedures for the preparation of conventional novolak and poly(vinylphenol) resins used as photoresist binders are well known in the art and disclosed in numerous publications including those discussed above. Novolak resins are the thermoplastic condensation products of a phenol and an aldehyde. Examples of suitable phenols for condensation with an aldehyde, especially formaldehyde, for the formation of novolak resins include phenol, m-cresol, o-cresol, p-cresol, 2,4-xylenol, 2,5-xylenol, 3,4-xylenol, 3,5-xylenol, and thymol. An acid catalyzed condensation reaction results in the formation of a suitable novolak resin which may vary in molecular weight from about 500 to 100,000 daltons. The preferred novolak resins conventionally used for the formation of photoresists are the cresol formaldehyde condensation products.

Poly(vinylphenol) resins are thermoplastic polymers that may be formed by block polymerization, emulsion polymerization or solution polymerization of the corresponding monomers in the presence of a cationic catalyst. Vinylphenols useful for the production of poly(vinylphenol) resins may be prepared, for example, by hydrolysis of commercially available coumarin or substituted coumarins, followed by decarboxylation of the resulting hydroxy cinnamic acids. useful vinylphenols may also be prepared by dehydration of the corresponding hydroxy alkyl phenols or by decarboxylation of hydroxy cinamic acids resulting from the reaction of substituted or non-substituted hydroxybenzaldehydes with malonic acid. Preferred poly(vinylphenol) resins prepared from such vinylphenols have a molecular weight range of from about 2,000 to about 100,000 daltons.

Other suitable phenolic resins include polystyrenes and copolymers of phenol and cyclic alcohols. The copolymer of a phenol and a cyclic alcohol may be formed by copolymerizing a phenol with a cyclohexanol or by hydrogenating a known phenolic resin. Details for the formation of such copolymers are disclosed in U.S. Pat. No. 5,258,257, incorporated herein by reference.

The photoactive compound used in combination with the alkali soluble resin to formulate a photoresist in accordance with the invention is a polyhydroxy alcohol having at least 1 ester group formed by condensation of a hydroxyl group with an o-quinone diazide sulfonyl halide and at least 1 acetal group formed by condensation of a hydroxyl group with a vinyl ether.

The preferred polyhydroxy alcohol used to form the photoactive compound is preferably a phenol conforming to the following general formula:

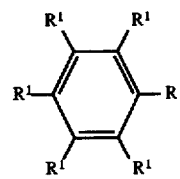

where $R^1$ is hydrogen, halogen, lower alkyl having from 1 to 4 carbon atoms, or hydroxyl; R is selected from the group of hydrogen, hydroxyl, or

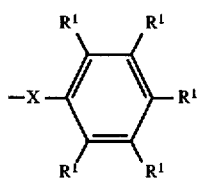

where X is a single C—C bond, —O—, —S—, —SO$_2$—, —C—, or —(CR$^2_2$)— where each R$^2$ is individually hydrogen, lower alkyl having from 1 to 4 carbon atoms, mononuclear aryl or

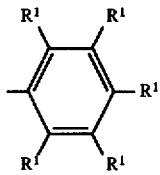

where each R$^1$ is as defined above; provided that at least 2 and preferably 4 R$^1$ s are hydroxyl.

Polyhydroxy compounds conforming to the above general formula include, without limitation, polyhydroxy benzenes such as resorcinol, pyrogallol, and glucinol; polyhydroxy phenylalkylketones such as 2,4-dihydroxy phenolpropylketone, 2,4-dihydroxy phenyl-N-hexylketone, and 2,3,4-trihydroxy phenyl-N-hexylketone; polyhydroxy phenalylketones such as 2,4-dihydroxy benzophenone, 2,3, 4-trihydroxy benzophenone, 2,4,6-trihydroxy benzophenone, 2,4,2',4'-tetrahydroxy benzophenone, 2,3,4, 4'-tetrahydroxy benzophenone, 2,3,4,2',4'-pentahydroxy benzophenone, 2,3,4,2',6'-pentahydroxy benzophenone, 2,3, 4,3',4',5'-hexahydroxy benzophenone, 2,4,6,3',4',5'- hexahydroxy-5-chloro benzophenone, and 2,3,4,3',4',5'- hexahydroxy-5-benzoyl benzophenone, his (p olyhydroxy phenyl) alkanes such as bis(2,4-dihydroxy phenyl) methane, 2,2-bis(2,4-dihydroxy phenyl) propane and 2,2-bis(2,3,4- trihydroxy phenyl) propane, alkyl polyhydroxy benzoic ester or allyl polyhydroxy benzoic ester such as propyl 3,4,5-trihydroxy benzoic ester and phenyl, 3,4,5-trihydroxy benzoic ester, bis(polyhydroxy benzyl) alkanes such as bis(2,4-dihydroxy benzoyl) methane, bis(2,3,4-trihydroxy benzoyl) methane, bis(2,4,6-trihydroxy benzoyl) methane, and 2,2-bis(2,3,4-trihydroxy phenyl) propane, bis (polyhydroxy benzoyl) benzenes such as p-bis(2,5- dihydroxy benzoyl) benzene, p-bis(2,3,4-trihydroxy benzoyl) benzene and p-bis(2,4,6-trihydroxy benzoyl), alkanediol di(polyhydroxy benzoate) such as ethyleneglycol di(3,5-dihydroxy benzoate), ethyleneglycol di(3,4,5-trihydroxy benzoate), 1,4-butanediol(3,4,5-trihydroxy benzoate) and 1,8 octanediol di (3,4,5-trihydroxy benzoate), polyethyleneglycol di (polyhydroxy benzoate) such as diethylene glycol di (3,4,5-trihydroxy benzoate) and triethyleneglycol di (3,4,5-trihydroxy benzoate), a-pyrone type natural color matters having hydroxyl groups such as hispydine, glubeldine, g-pyrone type natural color matters such as chricine, apigenin, quercetin, rutin, morin, nalingenin and purnetin, diazine type natural color matters such as leucopterine, entropterine, chrisopterine and iodinin, quinone type natural color matters such as atromenthyn, muscurphine, eugron, alizarne, purpurine and akirine, and resins having hydroxyl groups such as poly (hydroxystyrene), alkali-soluble novolak reins, and pyrogallol-acetone condensation resin may be mentioned. These polyhydroxy compounds are used alone or in combination of two or more and are preferred because their condensation product with an o-quinone diazide sulfonic acid halide are most likely to form particulates in solution during storage.

The polyhydroxy compound is condensed with both an o-quinone diazide sulfonyl halide, preferably an o-mphthoquinone diazide sulfonyl halide and a vinyl ether compound. The condensation of the acid halide and the polyhydroxy compound is conventional in the preparation of photoactive compounds, the reaction is known in the art, and the reaction does not constitute a part of this invention. Specific examples of naphthoquinone diazide sulfonic acid halides are 1,2-naphthoquinonediazide-5-sulfonyl chloride and 1,2-naphthoquinonediazide-4-sulfonyl chloride.

The vinyl ether condensed with remaining hydroxyl groups in accordance with the invention is one having at least one —(CH=CH)—O— group. The vinyl ether group would be bonded to hydrogen if it is a terminal group or bonded to a fragment of an organic compound if the vinyl ether group is a divalent internal group. The vinyl ether compound may have one or more vinyl ether groups and the number of vinyl ether groups does not appear to be critical.

Typical vinyl ether compounds suitable for purposes of the invention include compounds having one vinyl groups such as ethylvinyl ether, t-amylvinyl ether, t-butylvinyl ether, vinylisobutyl ether, vinylpropyl ether, vinyl-2- ethylhexyl ether, vinyloctadecyl ether, etc.; compounds having two vinyl groups such as hydroxybutylvinyl ether, aminopropylvinyl ether, butanediol-1,4-divinyl ether, cyclohexylvinyl ether, hexanedioldivinyl ether, hexanediolmonovinyl ether, etc., compounds having three vinyl groups such as triethyleneglycoldivinyl ether, diethyleneglycolmonovinyl ether, diethyleneglycoldivinyl ether, ethyleneglycol- butylvinyl ether, ethyleneglycoldivinyl ether, ethyleneglycol- monovinyl ether, tetraethyleneglycoldivinyl ether, triethylene- glycolmethylvinyl ether, etc., and compounds having 4 or more vinyl groups such as 1,4-cyclohexanoldimethanoldivinyl ether, propenyl ether of propylene carbonate, 1,1,1-tris(vinyloxymethyl)ethane, cyclohexanedimethanolmonovinyl ether, 2-diethylaminoethylvinyl ether, polyethyleneglycoldivinyl ether, polytetrahydrofurandivinyl ether-290, trimethylolpropanetrivinyl ether, 2010 vinyl ether urethane oligomer, 2020 vinyl ether urethane oligomer, bis(4-vinyloxybutyl) isophthalate, bis(4-vinyloxymethylcyclohexylmethyl) glutarate, and bis(4-vinyloxybutyl)succinate.

The vinyl ether is reacted with the polyhydroxy alcohol either before, after or simultaneously with the reaction of the o-quinonediazidesulfonyl halide with the polyhydroxy alcohol though a two step synthesis is preferred whereby the photoactive compound is first formed by reaction of the sulfonyl halide with the polyol and thereafter, the remaining hydroxyl groups are converted to acetals by reaction with the vinyl ether. Regardless of when the vinyl ether is reacted with the polyol in the reaction sequence, the reaction conditions typically comprise adding the vinyl ether to the solution of the photoactive compound having free hydroxyl groups. The mixture is dissolved in a suitable solvent. The reaction proceeds in the presence of a catalytic mount of a strong acid. Suitable solvents for the reaction include acetone, tetrahydrofuran, diglyme and dioxane. Typical acid catalysts include hydrochloric acid, sulfuric acid, malonic acid, and sulfonic acids.

It is desirable that the molar ratio of the free hydroxyl groups of the polyol to the vinyl ether not exceed 1 to 1 because excess vinyl ether may destabilize the solution. Preferably, at least 50 percent of the free hydroxyl groups are reacted with the vinyl ether, more preferably 75 percent and most preferably essentially all of the free hydroxyl groups are reacted with the vinyl ether.

In addition to the resin binder and photoactive compound prepared in accordance with the invention, other components may be contained within the photoresist composition as would be known to those skilled in the art. Typical additives include surfactants, dyes, sensitizers, etc.

The photoresist composition may be applied as a dry film or as a liquid coating composition. When applied as a liquid coating composition, the above components are dissolved in a suitable solvent. Typical solvents are known to those skilled in the art and include, by way of example, Cellosolve acetate, methyl Cellosolve acetate, ethyl Cellosolve acetate, propylene glycol monomethyl ether acetate, methyl lactate, ethyl lactate, 2-ethoxyethyl acetate, methyl pyruvate, ethyl pyruvate, methyl-3-methoxyproprionate, ethyl-3-ethoxyproprionate, N-methyl-2-pyrollidone, cyclohexanone, 2-hexanone, methyl ethyl ketone, 1,4-dioxane, ethylene glycol monoisopropyl ether, diethylene glycol monomethyl ether, diethylene glycol dimethyl ether, etc. When applied as a dry film, a liquid solution of the photoresist composition is applied to a substrate such as Mylar using heat and pressure at the time of application to a substrate.

For a liquid coating composition, the components of the photoresist are dissolved in one or more of the above solvents. On a dry solids basis, the resin binder comprises a major portion of the photoresist components and typically comprises in excess of 60 % by weight of the photoresist composition and preferably varies from about 70 to 95 % by weight of the composition. The photoactive compound is conventionally added in a commercially useful photoresist composition in an amount of from about 15 to 20% by weight.

The components of the photoresists are dissolved in a suitable solvent to make a liquid coating composition or dried on a carrier film to make a dry fi/m photoresist. When dissolved in a solvent, the concentration of total solids in the solvent may vary between 5 and 35 weight percent and more preferably, between 15 and 30 percent.

When the photoresist is in the form of a liquid coating composition, the composition is coated onto a substrate using art-recognized procedures such as spin coating, roller coating, doctoring, dipping, etc. Following application of the liquid coating composition to a substrate, the coated substrate is dried to remove solvents. Typical drying conditions comprise baking at a temperature of 50° to 120° C. for 0.1 to 3.0 minutes. Following drying, the dried coating is exposed to activating radiation in a desired image pattern to form a latent image. Thereafter, the coating is typically post-exposure baked and developed by contact with an alkaline developer. The post exposure bake typically comprises heating the coated substrates to a temperature between about 50° and 130° C. for 0.5 to 3.0 minutes.

In the above processing sequence, the step of exposure results in liberation of the indene carboxylic acid. The liberation of the indene carboxylic acid cleaves the acid labile group resulting in deblocking of the hydroxide group on the photoactive compound. The step of post exposure baking drives the cleavage reaction to completion. Deblocking of the acid labile group and concomitant formation of the hydroxyl group solubilizes the photoactive compound thereby providing regions with the coating of increased differential solubility compared to a photoactive compound that had not been blocked with the acid labile group. Enhanced differential solubility permits development of the exposed photoresist coating to provide images of increased resolution.

The photoresists of the invention are used in conventional manner. For example, they may be coated over a printed circuit board substrate in printed circuit manufacture, over a semiconductor wafer for the manufacture of integrated circuits, over a glass substrate for the manufacture of LCD's, or over a metallic substrate for chemical milling applications.

The invention will be better understood by reference to the examples that follow.

EXAMPLE 1

A solution was prepared by mixing 100 grams of a photoactive compound with 0.77 grams of propylvinyl ether and a catalytic amount of concentrated hydrochloric acid in 100 ml. of acetone solvent. The photoactive compound used was a 4'-hexafluoisoproplidenediphenol having 47 mole percent of its repeating units monosubstituted with 2,1,5-diazonaphthoquinone sulfonic acid groups and 53 mole percent of its repeating units disubstituted with said 2,1,5-napthoquinone diazide sulfonic acid groups. The solution was maintained at 25° C. for 24 hours with stirring. Acetone was then removed by evaporation and drying was continued for an additional 12 hours under vacuum at 25° C. Essentially all of the free hydroxyl groups were found to have reacted with the vinyl ether.

EXAMPLE 2

A photoresist mixture was prepared from 25 grams of the photoactive compound prepared in Example 1 and 75 grams of a mixed o,p-cresol novolak resin dissolved in propylene glycol monomethyl ether acetate. The photoresist mixture so prepared was spin-coated onto a 4 inch silicone wafer at 4,000 rpm to obtain a film having a wet film thickness of 0.9 microns. The film so formed was soft baked for 1 minute at 90° C. and then exposed to i-line radiation (365 nm). Clean 0.5 micron images were obtained at 160 mJ/cm$^2$ with no unexposed film thickness loss.

EXAMPLE 3

Example 2 was repeated except that the photoactive compound used was the photoactive compound of Example 1 prior to reaction with the propyl vinyl ether. Following exposure and development, clean 0.5 micron images were attained, but the exposure does required was 230 mJ/cm$^2$ and an unexposed film thickness loss of 10% occurred.

EXAMPLE 4

Two solutions were prepared. The first solution was a 25 percent w/w in propylene glycol monomethyl ether acetate of the photoactive compound used in Example 1 prior to reaction with propylvinyl ether. The second solution was of the same concentration but utilized the photoactive compound formed by reaction of the photoactive compound was reacted with the propylvinyl ether. Both solutions were filtered through a 0.2 micron filter and stored at 30° C. Following 1 day of storage, a precipitate was found in solution 1. No precipitate was found in solution 2. Solution 2 was maintained at 30° C. for an additional 20 days and no precipitate was found in the solution.

We claim:

1. A method for increasing the differential solubility of an imaged photoresist coating comprising an alkali soluble resin and an o-naphthoquinonediazide sulfonic acid ester photoactive compound, said method comprising the steps of:

a. providing a photoresist composition comprising said alkali soluble resin and photoactive compound dissolved in a solvent, said photoactive compound being a polyhydroxy alcohol having a portion of its hydroxyl groups esterified with an o-quinonediazide sulfonic acid halide and at least 50 mole percent of the remainder of the hydroxyl groups blocked with an acid labile blocking group formed by reaction of a vinyl ether with said hydroxyl groups, said blocking group capable of deblocking when contacted with an acid to reform a hydroxyl group, said photoactive compound having sufficient o-quinonediazide sulfonic acid substitution and being present in the photoresist composition in an amount sufficient to form a latent, developable image upon exposure to activating radiation, b. coating said photoresist on a substrate and drying the same to form a dried coating thereof, c. forming a latent image in said dried coating by exposure of the coating to a source of activating radiation in an image pattern; and d. baking the coating to liberate acid thereby deblocking the acid labile blocking groups.

2. The method of claim 1 where the polyhydroxy alcohol has at least 4 hydroxyl groups.

3. The method of claim 1 where the polyhydroxy alcohol is an aromatic alcohol.

4. The method of claim 1 where the vinyl ether is a compound having at least two —(CH=CH)—O— groups.

5. The method of claim 1 where the blocking group is an acetal.

6. The method of claim 1 where the resin is a novolak resin.

* * * * *